United States Patent
Kim et al.

(10) Patent No.: US 9,905,450 B2
(45) Date of Patent: Feb. 27, 2018

(54) WAFER PROCESSING BASE

(75) Inventors: Se Ra Kim, Daejeon (KR); Hyo Sook Joo, Daejeon (KR); Suk Ky Chang, Daejeon (KR); Jung Sup Shim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/316,264

(22) Filed: Dec. 9, 2011

(65) Prior Publication Data

US 2012/0202036 A1    Aug. 9, 2012

Related U.S. Application Data

(63) Continuation of application No. PCT/KR2010/003827, filed on Jun. 15, 2010.

(30) Foreign Application Priority Data

Jun. 15, 2009 (KR) .................. 10-2009-0052945

(51) Int. Cl.

| | |
|---|---|
| *C08L 33/08* | (2006.01) |
| *B29C 35/08* | (2006.01) |
| *H01L 21/683* | (2006.01) |
| *C09J 7/02* | (2006.01) |
| *C08G 18/62* | (2006.01) |

(Continued)

(52) U.S. Cl.
CPC ...... *H01L 21/6836* (2013.01); *C08G 18/6229* (2013.01); *C08G 18/8116* (2013.01); *C08L 33/08* (2013.01); *C09J 7/0267* (2013.01); *C09J 175/16* (2013.01); *C08G 2170/40* (2013.01); *C09J 2201/128* (2013.01); *C09J 2201/606* (2013.01); *C09J 2203/326* (2013.01); *C09J 2205/31* (2013.01); *C09J 2433/006* (2013.01); *C09J 2463/006* (2013.01); *C09J 2467/006* (2013.01); *C09J 2471/006* (2013.01);

(Continued)

(58) Field of Classification Search
USPC .............. 428/220; 525/289, 309; 264/494
See application file for complete search history.

(56) References Cited

U.S. PATENT DOCUMENTS

| | | |
|---|---|---|
| 2008/0190904 A1 | 8/2008 | Wakayama et al. |
| 2009/0017323 A1* | 1/2009 | Webb et al. ............. 428/521 |

(Continued)

FOREIGN PATENT DOCUMENTS

| | | |
|---|---|---|
| EP | 1695820 A1 | 8/2008 |
| EP | 2287264 A1 | 2/2011 |

(Continued)

*Primary Examiner* — Tahseen N Khan
(74) *Attorney, Agent, or Firm* — Dentons US LLP

(57) ABSTRACT

Provided is a substrate for processing a wafer. The present invention can provide a substrate having excellent heat resistance and dimensional stability. The present invention can provide a substrate that has excellent stress relaxation properties, and therefore can prevent a wafer from being destroyed due to residual stress. Also, the present invention can provide a substrate that can prevent a wafer from being damaged or fried off due to a non-uniformly applied pressure during the wafer processing process, and that exhibits excellent cuttability. For these reasons, the substrate can be useful as a sheet for processing a wafer in various wafer preparation processes such as dicing, back-grinding, and picking-up.

9 Claims, 1 Drawing Sheet

(51) Int. Cl.
*C08G 18/81* (2006.01)
*C09J 175/16* (2006.01)

(52) U.S. Cl.
CPC .......... *C09J 2475/006* (2013.01); *H01L 2221/6834* (2013.01); *H01L 2221/68327* (2013.01)

(56) References Cited

U.S. PATENT DOCUMENTS

2009/0261084 A1* 10/2009 Wakayama et al. ..... 219/121.85
2010/0243159 A1* 9/2010 Nishio et al. ................. 156/344

FOREIGN PATENT DOCUMENTS

| EP | 2444994 A2 | 4/2012 |
| JP | 2002141306 | 5/2002 |
| JP | 2005347382 | 12/2005 |
| JP | 2006-335860 A | 12/2006 |
| JP | 2007-045965 A | 2/2007 |
| JP | 2008 166727 A | 7/2008 |
| KR | 10-2001-0019894 A | 3/2001 |
| KR | 10-2006-0047526 A | 5/2006 |
| TW | 1385759 | 2/2013 |
| WO | 2009063793 A1 | 5/2009 |
| WO | WO 2009066435 A1 * | 5/2009 |

* cited by examiner

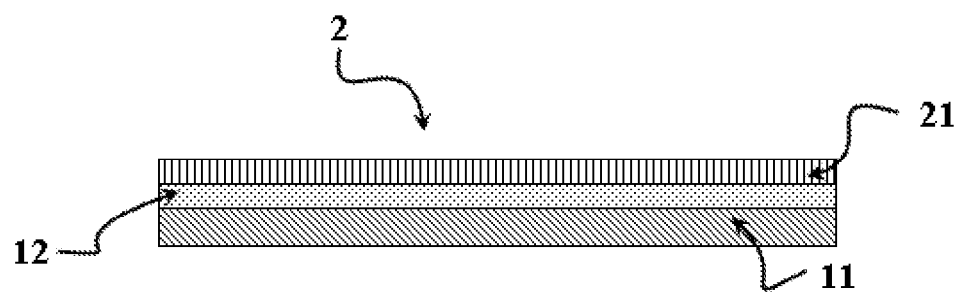

WAFER PROCESSING BASE

CROSS-REFERENCE TO RELATED APPLICATION

This application is a continuation application (bypass application), under 35 USC § 120, of International Patent Application No. PCT/KR2010/003827, filed on Jun. 15, 2010, which claims priority to and the benefit of Korean Patent Application No. 10-2009-0052945, filed Jun. 15, 2009, which is incorporated by reference in its entirety herein.

BACKGROUND

1. Field of the Invention

The present invention relates to a substrate used for processing a wafer.

2. Discussion of Related Art

A preparation method for a semiconductor device that includes a back-grinding process or dicing process, during which a sheet such as a surface protective sheet or dicing sheet is used.

Recently, since the demand for compact and lightweight semiconductor devices has increased, the performance of such a sheet for processing a wafer has accordingly become more and more important.

For example, in order to make a circuit having a higher degree of integration than a conventional method in which a circuit is formed only on one side of a wafer, circuits should be formed on both sides of a wafer. In order to form circuits on both sides of the wafer, the wafer to which a processing sheet is attached should be subjected to a high-temperature process. Thus, the sheet for processing a wafer requires excellent heat-resistance or dimensional stability at high temperature. However, when a hard substrate having a high melting point is used in order to secure heat resistance and dimensional stability, protection of the wafer is degraded and stress relaxation is also reduced, leading to a higher probability of damage to the wafer.

The sheet for processing a wafer should have excellent stress relaxation properties and have no protrusions such as fish eyes. When the stress relaxation properties are reduced or a protrusion is present on the sheet, the wafer becomes easily damaged due to residual stress or due to non-uniform pressure. Such a phenomenon is more common due to the demand for a wafer having a large diameter and small thickness.

Regarding the sheet for processing a wafer, excellent cuttability is required. When cuttability is decreased, a cutting defect may occur during the process, and thus wafer processing may be discontinuously performed. Consequently, when the cuttability of the sheet for processing a wafer is decreased, production efficiency can be reduced and the wafer can be damaged.

Korean Patent Publication No. 2006-0047526 discloses an adhesive sheet having a specific range of storage modulus for the prevention of damage to a wafer, even when being applied to a thin film of the wafer.

However, there are no currently-known techniques, including Korean Patent Publication No. 2006-0047526, for a sheet for processing a wafer that satisfies all of the properties as described above.

SUMMARY OF THE INVENTION

The present invention relates to a substrate used for processing a wafer, a method for manufacturing the same, a pressure sensitive adhesive sheet for processing a wafer, and a method of processing a wafer.

One aspect of the present invention provides a substrate for processing a wafer that is a photo-cured product of a photo-curable composition including a high-molecular weight polymer and monomer component. The substrate has a glass transition temperature ($T_g$) ranging from 20° C. to 45° C. and a toughness ranging from 10 kg·mm to 250 kg·mm at 23° C.

Hereinafter, the substrate for processing a wafer will be described in detail.

The substrate for processing a wafer is a photo-cured product of a photo-curable composition. The photo-cured product has a glass transition temperature and toughness in the above-described ranges. The term "photo-curable composition" used herein refers to a composition including a component that can be cross-linked, polymerized or cured by electromagnetic wave irradiation. The term "electromagnetic wave" used herein is a generic term including microwave, infrared (IR), ultraviolet (UV), X-ray and γ ray, and particle beams such as α-particle beams, proton beams, neutron beams, and electron beams.

The photo-cured product, i.e., the substrate, may have a glass transition temperature ranging from −20° C. to 45° C., preferably −10° C. to 40° C., more preferably −5° C. to 40° C., and most preferably 0° C. to 35° C. The glass transition temperature may be measured using a differential scanning calorimeter (DSC). In the present invention, if two or more glass transition temperatures are detected as a result of DSC analysis, then the average value of the detected glass transition temperatures that is calculated by considering each component of the composition is the glass transition temperature as a representative value. When the glass transition temperature is less than −20° C., it could become difficult for the photo-cured product to be applied as the substrate, and when the glass transition temperature is more than 40° C., the properties that the substrate follows the surface of a wafer, and the stress relaxation properties could be degraded.

The substrate may have a toughness that ranges from 10 kg·mm to 250 kg·mm, preferably 10 kg·mm to 200 kg·mm, more preferably 10 kg·mm to 150 kg·mm, and most preferably 25 kg·mm to 150 kg·mm at a temperature of 23° C., preferably 20° C. to 25° C., and more preferably 15° C. to 30° C. The toughness may be measured by a tension test. In detail, the photo-cured product, i.e., the substrate, is cut as a sample having a size of 15 mm×15 mm. Regarding the above, the size of the sample indicates that of a region which excludes the region taped to fix the sample to a tension tester during the tension test. After preparation of the sample, the sample is fixed to the tester to locate the vertical length thereof in the elongation direction of the tension tester, and then elongated in a vertical direction at a rate of 180 mm/min to 220 mm/min, preferably 200 mm/min at the measurement temperature. A graph of the force measured according to distance until the sample is cut is plotted. The force-versus-distance curve is integrated to estimate toughness.

When the toughness is less than 10 kg·mm, the substrate may become excessively stiff, or the photo-cured product may become difficult to form as a substrate. When the toughness is greater than 250 kg·mm, the cuttability may be reduced.

In the present invention, a kind of the photo-curable composition that forms a photo-cured product is not particularly limited, and it may be prepared by using various high-molecular weight polymers.

The term "high-molecular-weight polymer" used herein refers to a generic term indicating polymers that are prepared by polymerizing at least two monomers. The high-molecular weight polymer may have an average molecular weight ($M_w$) of about 500 to 1,000,000, preferably about 1,000 to 900,000, and more preferably about 3,000 to 800,000. The average molecular weight (Mw) refers to a converted value with respect to a standard polystyrene, as measured by gel permeation chromatography (GPC).

In one embodiment, the high-molecular weight polymer may be a polymer of a monomer mixture including a (meth)acrylate ester monomer (hereinafter, referred to as an "acrylic polymer"). In the specification, the photo-curable composition including the polymer of a monomer mixture including a (meth)acrylate ester monomer may be referred to as a "first type of photo-curable composition". When the high-molecular weight polymer is the above type, the photo-curable composition may include a partially polymerized product of a monomer mixture including the (meth)acrylate ester monomer. In the partially polymerized product, some monomers included in the monomer mixture are polymerized so as to form the high-molecular weight polymer, and the other un-reacted monomers are included in the partially polymerized product as monomer components. However, in the present invention, a method for preparing the photo-curable composition is not limited to the above-described method. For example, the photo-curable composition may be prepared by separately mixing a polymer with a monomer component, not by a partial polymerization method.

The kind of (meth)acrylate ester monomer included in the monomer mixture is not particularly limited, and, for example, at least one selected from the group consisting of alkyl(meth)acrylate; (meth)acrylate having an alkoxy group; (meth)acrylate having a alicyclic group; (meth)acrylate having an aromatic group; and (meth)acrylate having a heterocyclic moiety may be used.

Examples of the alkyl(meth)acrylate may include alkyl (meth)acrylates having alkyl groups of 1 to 14 carbon atoms, such as methyl(meth)acrylate, ethyl(meth)acrylate, n-propyl (meth)acrylate, isopropyl(meth)acrylate, n-butyl(meth)acrylate, t-butyl(meth)acrylate, sec-butyl(meth)acrylate, pentyl (meth)acrylate, 2-ethyl hexyl(meth)acrylate, 2-ethyl butyl (meth)acrylate, n-octyl(meth)acrylate, isooctyl(meth) acrylate, isononyl(meth)acrylate, lauryl(meth)acrylate and tetradecyl(meth)acrylate. Examples of the (meth)acrylate having an alkoxy group may include 2-(2-ethoxyethoxy) ethyl(meth)acrylate, ethyleneglycol phenyl ether(meth)acrylate, polyethyleneglycol (degree of polymerization: 2 to 8) phenyl ether(meth)acrylate, ethyleneglycol nonyl phenyl ether(meth)acrylate and polyethyleneglycol (degree of polymerization: 2 to 8) nonyl phenyl ether(meth)acrylate. Examples of the (meth)acrylate having an alicyclic group may include dicyclopentenyl(meth)acrylate and dicyclopentenyloxy(meth)acrylate; examples of the (meth)acrylate having an aromatic group may include phenylhydroxypropyl(meth)acrylate and benzyl(meth)acrylate; and examples of the (meth)acrylate having a heterocyclic moiety may include isobornyl(meth)acrylate, tetrahydrofurfuryl(meth) acrylate and morpholinyl(meth)acrylate. However, the kinds of monomers are not limited to the above examples.

In the present invention, the monomer mixture forming the partially polymerized product may further include a monomer having a polar functional group, for example, a hydroxyl group, a carboxyl group, a nitrogen-containing group or a glycidyl group. The monomer having a hydroxyl group may be 2-hydrorxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 2-hydroxyethyleneglycol(meth)acrylate or 2-hydroxypropyleneglycol(meth)acrylate; the monomer having a carboxyl group may be (meth)acrylic acid, 2-(meth)acryloyloxy acetic acid, 3-(meth)acryloyloxy propionic acid, 4-(meth)acryloyloxy butyric acid, acrylic acid dimer, itaconic acid, maleic acid or maleic acid anhydride; the monomer having a nitrogen-containing group may be (meth)acrylamide, N-vinyl pyrrolidone or N-vinyl caprolactam; and the monomer having a glycidyl group may be glycidyl(meth)acrylate. However, the kinds of monomers are not limited to the above examples.

The monomer mixture may further include a monomer other than the monomers described above, as necessary. The weight ratio of each component included in the monomer mixture is not particularly limited and may be adjusted according to the curing efficiency or desired properties of the photo-cured product, such as the glass transition temperature, the toughness, and the like.

The method for partially polymerizing the monomer mixture is not particularly limited, and the polymerization may be performed by using a conventional method such as bulk polymerization.

During partial polymerization of the monomer mixture, the conversion rate of the monomer is not particularly limited, and it may be controlled by considering the curing efficiency or the desired properties.

The first-type of photo-curable composition may further include a multi-functional acrylate. The multi-functional acrylate may be separately added after the above-described partial polymerization, or previously included in the monomer mixture before the partial polymerization in some cases. As necessary, the photo-curable composition may be prepared by separately mixing the high-molecular weight polymer, the monomer component, and the multi-functional acrylate.

In the present invention, the kind of multi-functional acrylate is not particularly limited. Examples of the multi-functional acrylate may include, but are not limited to, bifunctional acrylates such as 1,4-butanediol di(meth)acrylate, 1,6-hexanediol di(meth)acrylate, neopentylglycol di(meth)acrylate, polyethyleneglycol di(meth)acrylate, neopentylglycol adipate di(meth)acrylate, hydroxypivalic acid neopentylglycol di(meth)acrylate, dicyclopentanyl di(meth) acrylate, caprolactone-modified dicyclopentenyl di(meth) acrylate, ethyleneoxide-modified di(meth)acrylate, di(meth) acryloxy ethyl isocyanurate, allylated cyclohexyl di(meth) acrylate, tricyclodecane dimethanol(meth)acrylate, dimethylol dicyclopentane di(meth)acrylate, ethyleneoxide-modified hexahydrophthalic acid di(meth)acrylate, tricyclodecane dimethanol(meth)acrylate, neopentylglycol-modified trimethylpropane di(meth)acrylate, adamantane di(meth)acrylate, and 9,9-bis[4-(2-acryloyloxyethoxy)phenyl]fluorine; trifunctional acrylates such as trimethylolpropane tri(meth)acrylate, dipentaerythritol tri(meth)acrylate, propionic acid-modified dipentaerythritol tri(meth)acrylate, pentaerythritol tri(meth)acrylate, propyleneoxide-modified trimethylolpropane tri(meth)acrylate, trifunctional urethane (meth)acrylate, and tris(meth)acryloxyethylisocyanurate; tetrafunctional acrylates such as diglycerin tetra(meth)acrylate and pentaerythritol tetra(meth)acrylate; pentafunctional acrylates such as propionic acid-modified dipentaerythritol penta(meth)acrylate; and hexafunctional acrylates such as dipentaerythritol hexa(meth)acrylate, caprolactone-modified dipentaerythritol hexa(meth)acrylate, and urethane (meth)acrylate (e.g. a reaction product of isocyanate monomer and trimethylolpropane tri(meth)acrylate).

The multi-functional acrylate may be included in an amount of 0.01 to 10 parts by weight, relative to 100 parts by weight of the total weight of the high-molecular weight polymer and monomer component. However, the content may be altered according to the production efficiency or the properties of the photo-cured product, such as the glass transition temperature and toughness.

Unless otherwise defined in the present invention, the unit "part by weight" refers to the weight ratio.

The first-type of photo-curable composition may further include a photoinitiator, which may induce polymerization reaction of the polymer, monomer component or multi-functional acrylate by light irradiation.

The kind of photoinitiator usable herein is not particularly limited; and conventional photoinitiators such as a benzoin compound, hydroxyketone compound, aminoketone compound, peroxide compound or phosphineoxide compound may be used.

The photo-curable composition may include the photoinitiator in an amount of 0.01 to 10 parts by weight, though preferably 0.1 to 5 parts by weight, relative to 100 parts by weight of the total weight of the high-molecular weight polymer and monomer component. The weight ratio of the photoinitiator may be adjusted within the above range so as to induce effective curing and prevent degradation of the properties due to the components remaining after curing.

In another embodiment, the high-molecular weight polymer may be a component such as urethane acrylate, ester acrylate, ether acrylate or epoxy acrylate. Hereinafter, such an acrylate may be referred to as an "oligomer component", and the photo-curable composition including the component may be referred to as a "second type of photo-curable composition".

The urethane acrylate may be, but is not limited to, a reaction product of a polyisocyanate compound and hydroxyl-containing (meth)acrylate. In this case, the kind of polyisocyanate compound is not particularly limited. In the present invention, examples of the compound may include polyisocyanates having at least two isocyanate groups, such as aliphatic, cycloaliphatic or aromatic polyisocyanate. In detail, examples of the polyisocyanate may include 2,4-tolylene diisocyanate, 2,6-tolylene diisocyanate, 1,3-xylene diisocyanate, 1,4-xylene diisocyanate, and diphenylmethane-4,4'-diisocyanate isophorone diisocyanate. In the present invention, the examples of the hydroxyl-containing (meth)acrylate forming urethane acrylate may also include, but are not limited to, hydroxyalkyl(meth)acrylates such as 2-hydroxyethyl(meth)acrylate, 2-hydroxypropyl(meth)acrylate, 4-hydroxybutyl(meth)acrylate, 6-hydroxyhexyl(meth)acrylate, and 8-hydroxyoctyl(meth)acrylate.

In the present invention, a reaction product of the hydroxyl-containing (meth)acrylate and urethane prepolymer having isocyanate in its terminus, which is a reaction product of ester polyol and an isocyanate compound, may be used as urethane acrylate. the ester polyol usable herein may be a common component known in the art, for example, an esterification reaction product of polyol and/or ester polyol with an acid component such as a dibasic acid or anhydride thereof. The polyol may be ethylene glycol, propylene glycol, cyclohexane dimethanol or 3-methyl-1,5-pentanediol; the ester polyol may be a polyalkylene glycol such as polyethylene glycol, polypropylene glycol or polytetramethylene glycol, or a diol of a block or random polymer such as polyethylene polypropoxy block polymer diol; and the acid component may be a dibasic acid such as adipic acid, succinic acid, phthalic acid, tetrahydrophthalic acid, hexahydrophthalic acid or terephthalic acid, or anhydride thereof.

In addition, the examples of the isocyanate compound and hydroxyl-containing (meth)acrylate, which can be used herein, are the same as described above.

In one embodiment, a reaction product of the hydroxyl-containing (meth)acrylate and urethane prepolymer having isocyanate in its terminus, which is a reaction product of ether polyol and an isocyanate compound, may be used as urethane acrylate.

The ester acrylate usable herein may be a dehydrate condensation reaction product of ester polyol and (meth)acrylic acid. The ester polyol usable in this case may be a compound as described above.

The ether acrylate may be a polyalkylene glycol di(meth)acrylate such as polyethylene glycol di(meth)acrylate, polypropylene glycol di(meth)acrylate or polytetramethylene glycol di(meth)acrylate.

The epoxy acrylate usable herein may be an additional reaction product of an epoxy resin and (meth)acrylic acid. In this case, the kind of the epoxy resin may be, but is not limited to, a conventional aromatic or aliphatic epoxy resin known in the art.

A reaction condition or the weight ratio of the reactant is not particularly limited when preparing the oligomer component by reacting the above compounds. That is, considering the properties required in the photo-cured product, the reaction condition may be appropriately selected. If it is necessary, in the process of manufacturing the oligomer component, another component may be appropriately reacted with the components as described above.

It is preferable to use urethane acrylate as the oligomer component, but is not limited thereto.

The second-type of photo-curable composition may further include a reactive monomer.

The kind of reactive monomer usable herein is not particularly limited, but may include, for example, the monomer component as described in the first-type of photo-curable composition, such as (meth)acrylic acid ester monomer, monomer having a polar functional group, multi-functional acrylate, monomer having an akoxy group, monomer having an aromatic group or monomer having a heterocyclic moiety.

The monomer may be included in an amount of 10 to 400 parts by weight, relative to 100 parts by weight of the oligomer component. As the weight ratio of the monomer is adjusted in such a manner, it is possible to effectively form a layer using the photo-curable composition and to effectively control the properties of the photo-cured product.

The second-type of photo-curable composition may further include a photoinitiator as necessary. In this case, the kind of photoinitiator usable herein is described above. The photoinitiator may be included in an amount of 0.01 to 10 parts by weight, and preferably 0.1 to 5 parts by weight, relative to 100 parts by weight of the total weight of the high-molecular weight polymer and monomer component. Within the above weight ratio, it is possible to effectively induce curing and prevent degradation of the properties generated by the component remaining after curing.

In the present invention, the first-type or second-type of photo-curable composition may further include at least one additive selected from the group consisting of a dye and a pigment, an epoxy resin, a cross-linking agent, a UV stabilizer, an antioxidant, a coloring agent, a reinforcing agent, a filler, a foaming agent, a surfactant, a photothickening agent, and a plasticizer.

The shape of the substrate formed from the photo-cured product of the photo-curable composition is not particularly limited. The photo-cured product may be formed in the shape of a film or a sheet. Also, it is preferable to prepare the substrate in the shape of a film or a sheet through a casting process as described below, although it is not limited thereto. The thickness of the substrate in the shape of a film or a sheet is not particularly limited and may be from about 5 μm to 400 μm or from about 10 μm to 300 μm.

In one embodiment, regarding the process of preparing a sheet for processing a wafer as described below, in order to improve the adhesion strength between the substrate and a pressure-sensitive adhesive, the substrate may be subjected to a surface treatment process such as primer treatment or corona treatment. Also, in order to improve the efficiency of wafer processing, an appropriate color may be applied to the substrate.

Another aspect of the present invention provides a method for preparing a substrate for processing a wafer, involving casting a photo-curable composition that includes a high-molecular weight polymer and monomer component, that is capable of forming a photo-cured product having a glass transition temperature of −20° C. to 45° C. and a toughness of 10 kg·mm to 250 kg·mm at 23° C. and of curing the casted composition.

That is, in the present invention, the substrate may be prepared by forming a layer by subjecting a photo-curable composition including the above-described components to a casting process, and then curing the layer. By preparing the substrate through the above process, it is possible to prevent a protrusion such as a fish eye from being generated on the surface of the substrate and to prepare the substrate having a uniform plane. Thus, when the substrate is applied to wafer processing, it is possible to prevent a crack in the wafer and a flying-off phenomenon that could be induced when a non-uniform pressure is applied. Further, by preparing the substrate through such a method, the cuttability and stress relaxation properties of the substrate may be maximized.

The method for casting the photo-curable composition is not particularly limited. For example, bar coating method, knife coating method, roll coating method, spray coating method, gravure coating method, curtain coating method, comma coating method or lip coating method may be applied to obtain a desired thickness.

After the casting process, the casted composition is cured by irradiation with electromagnetic waves such as UV rays therewith. In this case, a method for irradiating the composition with electromagnetic waves is not particularly limited, and a conventional method known in the art may be employed. For example, in the case of UV irradiation, it may be performed using a metal halide lamp, a high-pressure mercury lamp, a black light lamp, an electrodeless lamp or a xenon lamp. The UV irradiation conditions are not particularly limited but may be selected according to the composition to be cured or the property required in the photo-cured product.

Still another aspect of the present invention provides a pressure-sensitive adhesive sheet for processing a wafer, including the substrate as described above, and a pressure sensitive adhesive layer formed on one side or both sides of the substrate.

The pressure-sensitive adhesive sheet may be used as a surface protective sheet in a back-grinding process, a dicing sheet or a pick-up sheet.

FIG. 1 is a cross-sectional view of one exemplary pressure sensitive adhesive sheet 1. Referring to FIG. 1, a pressure sensitive adhesive sheet 1 may include the substrate 11 described above, as well as a pressure-sensitive adhesive layer 12 formed on the substrate 11.

The kind of pressure-sensitive adhesive layer 12 included in the pressure-sensitive adhesive sheet is not particularly limited. In this field, various pressure-sensitive adhesives usable in the pressure-sensitive adhesive sheet for processing a wafer such as a surface protective sheet, a dicing sheet or a pick-up sheet are disclosed, and an appropriate one among these can be selected without limitation. For example, as the pressure-sensitive adhesive layer, a silicon pressure-sensitive adhesive, a synthetic rubber pressure-sensitive adhesive, a natural rubber pressure-sensitive adhesive or an acrylic pressure-sensitive adhesive may be used. Preferably, an acrylic pressure-sensitive adhesive, more preferably a pressure-sensitive adhesive, including an acrylic polymer cross-linked by a multi-functional cross-linking agent, may be used, but the present invention is not limited thereto.

The thickness of the pressure-sensitive adhesive layer is not particularly limited, and it may be adjusted in a range of about 0.5 μm to 60 μm, and preferably about 1 μm to 40 μm.

As shown in FIG. 2, a pressure-sensitive adhesive sheet 2 for processing a wafer may further include an appropriate releasing sheet 21 stacked on the pressure-sensitive adhesive layer 12 in order to prevent impurities from being introduced into the pressure-sensitive adhesive layer 12.

Yet another aspect of the present invention provides a method for processing a wafer, including attaching the pressure-sensitive adhesive sheet of the present invention to a wafer and processing the wafer to which the pressure-sensitive adhesive sheet is attached.

The method of processing a wafer is characterized by using the pressure-sensitive adhesive sheet according to the present invention. For example, the pressure-sensitive adhesive sheet is laminated to the wafer by press or hot-roll lamination, and then processing of the wafer may be carried out.

The process for processing the wafer may be a dicing, back-grinding or a pick-up process, and, in this case, the processing conditions are not particularly limited.

BRIEF DESCRIPTION OF THE DRAWINGS

The above and other objects, features and advantages of the present invention will become more apparent to those of ordinary skill in the art by describing in detail exemplary embodiments thereof with reference to the attached drawings, in which:

FIGS. 1 and 2 are cross-sectional views of an exemplary pressure-sensitive adhesive sheet for processing a wafer according to the present invention.

DETAILED DESCRIPTION OF EXEMPLARY EMBODIMENTS

Hereinafter, exemplary embodiments of the present invention will be described in detail.

Preparation Example 1. Preparation of Partially Polymerized Product (A1)

A monomer mixture of 60 parts by weight of 2-ethylhexyl acrylate (2-EHA), 35 parts by weight of isobornyl acrylate (IBOA) and 5 parts by weight of acrylic acid (AA) was input into a 1 L reactor containing refluxed nitrogen gas and a cooling apparatus for easy control of the temperature. The nitrogen gas was then purged in order to remove oxygen. Afterwards, the mixture was homogenized while maintaining the temperature at 60° C., and the reaction was initiated by adding 0.015 parts by weight of diethylhexyl peroxydicarbonate as an initiator and 0.08 parts by weight of n-dodecyl mercaptan (n-DDM) as a chain transfer agent so as to prepare a partially-polymerized acrylic syrup having a solid content of 25 wt %, a weight average molecular weight of 400,000 and a glass transition temperature of −21° C. In the above, the weight average molecular weight of the syrup was the weight average molecular weight of the polymer included in the syrup.

Preparation Example 2. Preparation of Partially Polymerized Product (A2)

A monomer mixture of 70 parts by weight of 2-ethylhexyl acrylate (2-EHA), 27 parts by weight of isobornyl acrylate (IBOA) and 3 parts by weight of hydroxyethyl acrylate (HEA) was input into a 1 L reactor containing refluxed nitrogen gas and a cooling apparatus for easy control of the temperature. The nitrogen gas was then purged in order to remove oxygen. Afterwards, the mixture was homogenized while maintaining the temperature at 60° C., and the reaction was initiated by adding 0.015 parts by weight of diethylhexyl peroxydicarbonate as an initiator and 0.04 parts by weight of n-dodecyl mercaptan (n-DDM) as a chain transfer agent so as to prepare a partially-polymerized acrylic syrup having a solid content of 35 wt %, a weight average molecular weight of 800,000 and a glass transition temperature of −36° C. In the above, the weight average molecular weight of the syrup was the weight average molecular weight of the polymer included in the syrup.

Example 1

A photo-curable composition was prepared by mixing 30 parts by weight of isobornyl acrylate (IBOA) with 70 parts by weight of the partially polymerized product (A1), adding 1.0 part by weight of 1,6-hexanediol diacrylate as a multifunctional acrylate and 1.0 part by weight of 1-hydroxycyclohexyl phenyl ketone (Igacure 184) as a photoinitiator thereto, and mixing and defoaming the resultant mixture. Afterwards, the resultant composition was coated on a polyester releasing film using a bar coater to a thickness of about 140 μm. Subsequently, to prevent the coated layer from being in contact with oxygen, another polyester releasing film was laminated on the coated layer while UV-A irradiation was performed using a metal halide lamp at a light intensity of 800 mJ/cm$^2$, thereby preparing a photo-cured product (substrate).

Examples 2 to 7 and Comparative Examples 1 to 3

Photo-cured products were prepared by the same method as in Example 1, except that the composition of the photo-curable composition was changed as summarized in Table 1.

TABLE 1

| | | Example | | | | | | | Comparative Example | | |
|---|---|---|---|---|---|---|---|---|---|---|---|
| | | 1 | 2 | 3 | 4 | 5 | 6 | 7 | 1 | 2 | 3 |
| High-Molecular-Weight Polymer | Partially Polymerized product(A1) | 70 | — | — | — | — | — | — | — | — | — |
| | Partially Polymerized product(A2) | — | 50 | — | — | — | — | — | 70 | — | — |
| | Oligomer(A3) | — | — | 50 | 40 | — | — | — | — | — | — |
| | Oligomer(A4) | — | — | — | — | 30 | 40 | — | — | 40 | — |
| | Oligomer(A5) | — | — | — | — | — | — | 45 | — | — | 50 |
| Monomer Component | IBOA | 30 | 43 | 40 | — | 25 | 40 | 10 | 10 | 50 | 30 |
| | t-BA | — | — | — | 38 | — | — | — | — | — | — |
| | EHA | — | — | 10 | 15 | — | — | 45 | 20 | — | 20 |
| | EOEOEA | — | — | — | — | — | 15 | — | — | — | — |
| | PHEA | — | — | — | — | 45 | — | — | — | — | — |
| | AA | — | 7 | — | 7 | — | — | — | — | 10 | — |
| | HEA | — | — | — | — | — | 5 | — | — | — | — |
| MFA | | 1.0 | 1.0 | — | — | — | — | — | 1.0 | — | — |
| Photoinitiator | | 1.0 | 0.7 | 0.5 | 0.5 | 0.5 | 0.5 | 1.0 | 1.0 | 0.5 | 1.0 |

OligomerA3: Urethane Acrylate(T$_g$: 20° C., M$_w$: 8,000)
OligomerA4: Urethane Acrylate(T$_g$: −10° C., M$_w$: 20,000)
OligomerA5: Epoxy Acrylate(T$_g$: 54° C., M$_w$: 3,000)
IBOA: Isobornyl Acrylate(T$_g$: 94° C.)
t-BA: t-Butyl Acrylate(T$_g$: 43° C.)
EHA: 2-Ethylhexyl Acrylate(T$_g$: −65° C.)
EOEOEA: 2-(2-Ethoxyethoxy)ethyl Acrylate(T$_g$: −70° C.)
PHEA: Phenoxyethyl Acrylate(T$_g$: −22° C.)
AA: Acrylic Acid(T$_g$: 106° C.)
HEA: 2-Hydroxyethyl Acrylate(T$_g$: −15° C.)
MFA: 1, 6-Hexanediol Diacrylate
Photoinitiator: Igacure 184
Content Unit: Part by Weight Comparative Example 4

A polypropylene film (melting point (T$_m$): 80° C.) having a thickness of 140 μm was used as a substrate of Comparative Example 4 in order to compare properties.

The properties of the substrates of the Examples and Comparative Examples were evaluated by the method described below, and the results are summarized in Table 2.
<Measurement of Glass Transition Temperature (T$_g$)>

The glass transition temperature was measured by using a differential scanning calorimeter (TA Instruments, Inc.) at a heating rate of 10° C./min. When at least two glass transition temperatures were detected, an average value calculated by considering the weight ratio of each component in the composition was determined as the glass transition temperature.

<Measurement of Toughness Value>

Samples were prepared by cutting the substrates of the Examples and Comparative Examples to a size of 15 mm×35 mm (width×length). Afterwards, the samples were taped on the top and bottom sides of the sample in the length direction with lengths of 10 mm each. Subsequently, the taped top and bottom sides of the sample were fixed to a measuring apparatus (XP Plus, TA, Inc.) in a perpendicular direction with respect to the apparatus. Then, the sample was elongated at a rate of 200 mm/min and at a temperature of 23° C., and a graph of force (Y axis) measured according to distance (X axis) until the sample was cut was plotted. The distance-versus-force curve was integrated to estimate toughness.

<Evaluation of Formability of Substrate>

Formability of the substrate was evaluated according to the following criteria.

<Criteria for Evaluating Formability of Substrate>

O: The case in which the cured product having a supporting force and a shape enough to function as the substrate was formed.

X: The case in which the cured product was too viscous, did not have a supporting force enough to function as the substrate or did not have the shape as the substrate.

<Evaluation of Cuttability>

Preparation of Pressure-Sensitive Adhesive Sheet

A pressure-sensitive adhesive layer having a thickness of 30 μm was formed on each of the substrates of the Examples and Comparative Examples by using the product obtained by reacting an acrylic polymer consisting of 90 parts by weight of 2-ethylhexyl acrylate (2-EHA) and 10 parts by weight of 2-hydroxy ethyl acrylate (HEA) in polymerized form with methacryloyloxyethyl isocyanate (MOI), thereby preparing a pressure-sensitive adhesive sheet.

Evaluation of Cut Property

An 8-inch silicon (Si) wafer was attached to the pressure-sensitive sheet using a wafer mounter, and the sheet was cut along the shape of the wafer using an expender (HS-1810, Hugle electronics, Inc.). Subsequently, the height of the stage was set to 3 to observe the cutting plane of the sheet. In detail, the starting and intermediate portions of the cutting plane were observed using an optical microscope, and cuttability was measured by evaluating burr generation and torn degree in the cutting plane according to the following criteria:

o: The case in which an area rate of a torn part with respect to the total area of the film is 3% or less when the starting portion of the cutting of the sheet was observed at a magnification of 50× and a resolution of 640×480.

Δ: The case in which an area rate of a torn part with respect to the total area of the film is 4% to 7% when the starting portion of the cutting of the sheet was observed at a magnification of 50× and a resolution of 640×480.

x: The case in which an area rate of a torn part with respect to the total area of the film is 8% or more when the starting portion of the cutting of the sheet was observed at a magnification of 50× and a resolution of 640×480.

<Evaluation of Adhesion Strength>

An 8-inch silicon (Si) wafer was attached to the same pressure-sensitive adhesive sheet as used when measuring the cuttability using a wafer mounter (DS Precision, Inc. DYWMDS-8'), and a surface of the attached wafer was observed to count lamination bubbles to evaluate the adhesion strength according to the following criteria.

<Criteria for Evaluating Adhesion> o: 3 or less bubbles are generated.

Δ: 4 to 7 bubbles are generated.

x: 8 or more bubbles are generated.

<Evaluation of Grindability of Wafer>

An 8-inch silicon (Si) wafer was attached to the same pressure-sensitive adhesive sheet as used when measuring the cuttability using a wafer mounter (DS Precision, Inc. DYWMDS-8'), and the film was cut along the shape of the wafer using an expender. Subsequently, the wafer was grinded using a wafer back-grinder (SVG-502MKII8), and the grindability of the wafer was evaluated based on the frequencies of warpage, damage and cracking of the wafer according to the following criteria:

o: The wafer suffered no warpage, damage or cracking.

Δ: The wafer suffered warpage of about 1 to 5 mm, or weak damage and/or cracking.

x: The wafer suffered warpage greater than 5 mm, or large damage and cracking.

The observation results are summarized in Table 2.

TABLE 2

|  | Example | | | | | | | Comparative Example | | | |
|---|---|---|---|---|---|---|---|---|---|---|---|
|  | 1 | 2 | 3 | 4 | 5 | 6 | 7 | 1 | 2 | 3 | 4 |
| Glass Transition Temperature(° C.) | 5 | 16 | 32 | 15 | 4 | 9 | 0 | −34 | 61 | 35 | — |
| Toughness(Kg · mm) | 60 | 40 | 110 | 120 | 190 | 130 | 30 | — | 5 | 8 | 500 |
| Substrate Formability | O | O | O | O | O | O | O | X | O | O | O |
| Cuttability | O | O | O | O | O | O | O | — | X | X | X |
| Adhesion strength | O | O | O | O | O | O | O | — | X | O | O |
| Wafer Grindability | O | O | O | O | O | O | O | — | X | Δ | X |

As seen in Table 2, the Examples according to the present invention showed excellent substrate formability, and also excellent cuttability, adhesion strength and grindability required to be a sheet for processing a wafer.

On the other hand, as in Comparative Example 1, due to the excessively low glass transition temperature, the toughness could not be measured, and due to the difficulty in forming the substrate, the cuttability, adhesion strength and grindability were also difficult to measure.

Comparative Example 2 had a high glass transition temperature and low toughness, resulting in poor cuttability, adhesion strength and grindability.

Comparative Example 3 exhibited poor cuttability and grindability due to low toughness. In addition, Comparative Example 4 having no glass transition temperature and high toughness also exhibited very poor cuttability and grindability.

Consequently, the present invention can provide a substrate having excellent heat resistance and dimensional stability. The present invention can provide a substrate that has excellent stress relaxation properties and therefore can prevent a wafer from being destroyed due to residual stress. Also, the present invention can provide a substrate that can prevent a wafer from being damaged or flied off due to a non-uniformly applied pressure during the wafer processing process, and that exhibits an excellent cuttability. For these reasons, the substrate can be useful as a sheet for processing a wafer in various wafer preparation processes such as dicing, back-grinding, and picking-up.

While the invention has been shown and described in reference to certain exemplary embodiments thereof, it will be understood by those skilled in the art that various changes in form and details may be made therein without departing from the spirit and scope of the invention as defined by the appended claims.

That which is claimed:

1. A pressure-sensitive adhesive sheet for processing a wafer, comprising:
    a heat resistant substrate that is a photo-cured product of a photo-curable composition, and
    a pressure-sensitive adhesive layer formed on one or both sides of the substrate and coming in contact with the substrate,
    wherein the photo-curable composition comprises a high-molecular weight acrylic polymer and a monomer component,
    wherein the substrate has a glass transition temperature of −20° C. to 45° C. and a toughness of 10 kg·mm to 250 kg·mm at 23° C.,
    wherein the high-molecular weight acrylic polymer comprises a partially polymerized product of a monomer mixture including:
        (a) an alkyl(meth)acrylate having an alkyl group having 1 to 14 carbon atoms;
        (b) at least one selected from the group consisting of a (meth)acrylate having an alkoxy group; a (meth)acrylate having a alicyclic group; a (meth)acrylate having an aromatic group; and a (meth)acrylate having a heterocyclic moiety; and
        (c) a monomer having a hydroxyl group, carboxyl group, nitrogen-containing group or glycidyl group, and
    wherein the monomer mixture does not include urethane acrylate.

2. The pressure-sensitive adhesive sheet for processing a wafer according to claim 1, wherein the substrate has a glass transition temperature of −10° C. to 40° C.

3. The pressure-sensitive adhesive sheet for processing a wafer according to claim 1, wherein the substrate has a toughness of 10 kg·mm to 200 kg·mm at 23° C.

4. The pressure-sensitive adhesive sheet for processing a wafer according to claim 1, wherein the substrate has a toughness of 10 kg·mm to 250 kg·mm at 20° C. to 25° C.

5. The pressure-sensitive adhesive sheet for processing a wafer according to claim 1, wherein the high-molecular weight acrylic polymer has an average molecular weight of 500 to 1,000,000.

6. The pressure-sensitive adhesive sheet for processing a wafer according to claim 1, wherein the photo-curable composition further comprises multi-functional acrylate.

7. The pressure-sensitive adhesive sheet for processing a wafer according to claim 1, wherein the photo-curable composition further comprises a photoinitiator.

8. The pressure-sensitive adhesive sheet for processing a wafer according to claim 1, wherein the substrate has a thickness of 5 μm to 400 μm.

9. The pressure-sensitive adhesive sheet for processing a wafer according to claim 1, wherein the pressure-sensitive adhesive layer comprising an acrylic polymer that is cross-linked by a multi-functional cross-linking agent.

* * * * *